US011121543B2

(12) United States Patent
Majumder et al.

(10) Patent No.: US 11,121,543 B2
(45) Date of Patent: Sep. 14, 2021

(54) FAULT MITIGATION IN MEDIUM VOLTAGE DISTRIBUTION NETWORKS

(71) Applicant: ABB Schweiz AG, Baden (CH)

(72) Inventors: Ritwik Majumder, Västerås (SE);
Frans Dijkhuizen, Västerås (SE);
Bertil Berggren, Västerås (SE)

(73) Assignee: ABB Schweiz AG, Baden (CH)

( * ) Notice: Subject to any disclaimer, the term of this patent is extended or adjusted under 35 U.S.C. 154(b) by 438 days.

(21) Appl. No.: 16/236,889

(22) Filed: Dec. 31, 2018

(65) Prior Publication Data
US 2020/0212668 A1 Jul. 2, 2020

(51) Int. Cl.
H02H 7/26 (2006.01)
H02H 1/00 (2006.01)

(52) U.S. Cl.
CPC .............. H02H 7/26 (2013.01); H02H 1/0007 (2013.01)

(58) Field of Classification Search
CPC ...... G01R 31/081; H02H 1/0007; H02H 7/26; H02J 3/00125; H02J 3/0073; H02J 3/36; Y02E 60/60; Y04S 10/52
See application file for complete search history.

(56) References Cited

U.S. PATENT DOCUMENTS

| 6,459,998 B1 | 10/2002 | Hoffman |
| 9,698,589 B1 | 7/2017 | Leyh |
| 9,893,633 B1 | 2/2018 | Li et al. |
| 10,622,805 B2 * | 4/2020 | Ishchenko ................. H02J 3/14 |
| 10,819,112 B1 * | 10/2020 | Pan ............................ H02J 3/06 |

(Continued)

FOREIGN PATENT DOCUMENTS

| CA | 2910713 A1 | 5/2016 |
| CA | 2913441 A1 | 5/2016 |

(Continued)

OTHER PUBLICATIONS

IEEE Standards Association; "IEEE Trial-Use Guide for Smart Distribution Applications"; IEEE Xplore Digital Library [online]. ieeexplore.ieee.org [retrieved on Aug. 22, 2019]. Retrieved from the Internet: <URL:https://ieeexplore.ieee.org/stamp/stamp.jsp?tp=&arnumber=8820199> (Year: 2019).*

(Continued)

Primary Examiner — Jared Fureman
Assistant Examiner — Nicolas Bellido
(74) Attorney, Agent, or Firm — Greenberg Traurig, LLP

(57) ABSTRACT

Unique systems, methods, techniques and apparatuses of fault mitigation are disclosed. One exemplary embodiment is a fault mitigation system for a medium voltage alternating current (MVAC) distribution network including a direct current (DC) link and a control system. The DC link is coupled to a first feeder line and a second feeder line. The control system is structured to determine a first feeder line is deenergized, operate the DC link so as to receive MVAC from a second feeder line and output low voltage alternating current (LVAC) to the first feeder line, operate a plurality of isolation devices, measure the LVAC in response to operating the plurality of isolation devices, determine a fault is isolated from a healthy portion of the first feeder line using the received LVAC measurements, and reenergize the healthy portion of the first feeder line.

20 Claims, 7 Drawing Sheets

(56) References Cited

U.S. PATENT DOCUMENTS

| | | | |
|---|---|---|---|
| 2002/0012210 A1 | 1/2002 | Morris et al. | |
| 2005/0168891 A1 | 8/2005 | Nilman-Johansson et al. | |
| 2013/0024033 A1* | 1/2013 | Fan | H02J 3/0073 700/291 |
| 2015/0349655 A1 | 12/2015 | Petersen et al. | |
| 2016/0056729 A1 | 2/2016 | Tenca | |
| 2016/0072270 A1* | 3/2016 | Rostron | H02H 3/081 700/294 |
| 2016/0146192 A1 | 5/2016 | Kurthakoti Chandrashekhara et al. | |
| 2016/0181802 A1 | 6/2016 | Jacobson et al. | |
| 2016/0336928 A1 | 11/2016 | Kuznetsov | |
| 2016/0380429 A1 | 12/2016 | Krstic | |
| 2017/0077699 A1 | 3/2017 | Kondabathini et al. | |
| 2017/0077746 A1 | 3/2017 | Kanakasabai et al. | |
| 2017/0110969 A1 | 4/2017 | Zhou et al. | |
| 2017/0141694 A1 | 5/2017 | Keister et al. | |
| 2017/0338651 A1 | 11/2017 | Fishman et al. | |
| 2017/0338748 A1 | 11/2017 | Liang et al. | |
| 2017/0346398 A1 | 11/2017 | Long et al. | |
| 2018/0006570 A1 | 1/2018 | Keister et al. | |
| 2020/0313423 A1* | 10/2020 | Pan | H02H 7/262 |

FOREIGN PATENT DOCUMENTS

| | | |
|---|---|---|
| CN | 201457837 U | 5/2010 |
| CN | 102545200 A | 7/2012 |
| CN | 202840667 U | 3/2013 |
| CN | 104218805 A | 12/2014 |
| CN | 104320000 A | 1/2015 |
| CN | 104333033 A | 2/2015 |
| CN | 104485821 A | 4/2015 |
| CN | 104539187 A | 4/2015 |
| CN | 102938564 B | 5/2015 |
| CN | 204333981 U | 5/2015 |
| CN | 204391761 U | 6/2015 |
| CN | 104852583 A | 8/2015 |
| CN | 105023058 A | 11/2015 |
| CN | 105634273 A | 6/2016 |
| CN | 105719196 A | 6/2016 |
| CN | 105762790 A | 7/2016 |
| CN | 105790294 A | 7/2016 |
| CN | 205430053 U | 8/2016 |
| CN | 205544542 U | 8/2016 |
| CN | 106099900 A | 11/2016 |
| CN | 106229984 A | 12/2016 |
| CN | 106356834 A | 1/2017 |
| CN | 106357138 A | 1/2017 |
| CN | 106451439 A | 2/2017 |
| CN | 106505558 A | 3/2017 |
| CN | 106602608 A | 4/2017 |
| CN | 206117151 U | 4/2017 |
| CN | 104934972 B | 5/2017 |
| CN | 106655267 A | 5/2017 |
| CN | 106711994 A | 5/2017 |
| CN | 106712561 A | 5/2017 |
| CN | 106786598 A | 5/2017 |
| CN | 206302343 U | 7/2017 |
| CN | 107070249 A | 8/2017 |
| CN | 107086787 A | 8/2017 |
| CN | 107086806 A | 8/2017 |
| CN | 107104416 A | 8/2017 |
| CN | 107257121 A | 10/2017 |
| CN | 107332443 A | 11/2017 |
| CN | 107565834 A | 1/2018 |
| CN | 107592017 A | 1/2018 |
| CN | 107612012 A | 1/2018 |
| CN | 107681886 A | 2/2018 |
| CN | 107706905 A | 2/2018 |
| CN | 107733244 A | 2/2018 |
| CN | 107786099 A | 3/2018 |
| CN | 107800298 A | 3/2018 |
| CN | 107800299 A | 3/2018 |
| CN | 107834854 A | 3/2018 |
| CN | 107863884 A | 3/2018 |
| CN | 107887924 A | 4/2018 |
| CN | 107947146 A | 4/2018 |
| CN | 107968570 A | 4/2018 |
| CN | 107968572 A | 4/2018 |
| CN | 207339264 U | 5/2018 |
| CN | 108418236 A | 8/2018 |
| EP | 0333139 A1 | 9/1989 |
| EP | 2996237 A1 | 3/2016 |
| EP | 3018794 A1 | 5/2016 |
| EP | 3062434 A1 | 8/2016 |
| EP | 3109992 A1 | 12/2016 |
| IN | 1246/CHE/2013 A | 9/2013 |
| JP | 2001298850 A | 10/2001 |
| JP | 2002191105 A | 7/2002 |
| JP | 2007020373 A | 1/2007 |
| JP | 2012029501 A | 2/2012 |
| KR | 20160040378 A | 4/2016 |
| KR | 20160081067 A | 7/2016 |
| WO | 2012116748 A1 | 9/2012 |
| WO | 2015090365 A1 | 6/2015 |
| WO | 2016054412 A1 | 4/2016 |
| WO | 2017058253 A1 | 4/2017 |
| WO | 2018041338 A1 | 3/2018 |
| WO | 2018072837 A1 | 4/2018 |
| WO | 2018079905 A1 | 5/2018 |

OTHER PUBLICATIONS

Allen, Will; "Effects of Wide-Area Control on the Protection and Operation of Distribution Networks"; IEEE Xplore Digital Library [online]. ieeexplore.ieee.org [retrieved on Sep. 9, 2009]. Retrieved from the Internet: <URL: https://ieeexplore.ieee.org/stamp/stamp.jsp?tp=&arnumber=5262330> (Year: 2009).*

Greer, Richard; "Distribution Automation Systems with Advanced Features"; IEEE Xplore Digital Library [online], ieeexplore.ieee.org [retrieved on Mar. 17, 2011]. Retrieved from the Internet: <URL: https://ieeexplore.ieee.org/stamp/stamp.jsp?tp=&arnumber=5756721> (Year: 2011).*

Patent Cooperation Treaty, International Search Report and Written Opinion in corresponding application No. PCT/IB19/61043, dated Apr. 1, 2020, 13 pp.

T. Hong et al., "A Reconfigurable Auto-Loop Microgrid," IEEE Transactions on Power Delivery, dated Jun. 2015, pp. 1644-1645, vol. 30, No. 3, IEEE, New York, US.

A. Shekhar et al., "Reconfigurable DC Links for Restructuring Existing Medium Voltage AC Distribution Grids," Electric Power Components and Systems, dated Jan. 16, 2018, last accessed Oct. 4, 2018, available at https://www.tandfonline.com/doi/pdf/10.1080/15325008.2017.1346005?needAccess=true.

X.B. Guo et al., "A Coordinated Optimization Method of SNOP and Tie Switch Operation Simultaneously Based on Cost in Active Distribution Network," CIRED Workshop 2016, dated Feb. 23, 2017, 4 pages, IET, New Jersey, USA.

* cited by examiner

FAULT MITIGATION IN MEDIUM VOLTAGE DISTRIBUTION NETWORKS

BACKGROUND

The present disclosure relates generally to medium voltage alternating current (MVAC) distribution networks. Fault location and isolation is an important function of distribution control systems. Existing fault location and isolation methods for network control systems suffer from a number of shortcomings and disadvantages. There remain unmet needs including decreasing stress on feeder line components, reducing network downtime, and increasing longevity of devices in distribution networks. For instance, after a substation circuit breaker trips in response to a fault, an entire feeder line is deenergized so as to eliminate any fault current. Without the fault current and voltage, the location of the fault is difficult to detect. Therefore, in order to detect the location of the fault, distribution networks normally require feeder line components to be subjected to high-fault currents while a distribution control system iteratively recloses the substation circuit breaker and disconnector switches until a fault is located and isolated. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for fault mitigation in medium voltage distribution networks. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
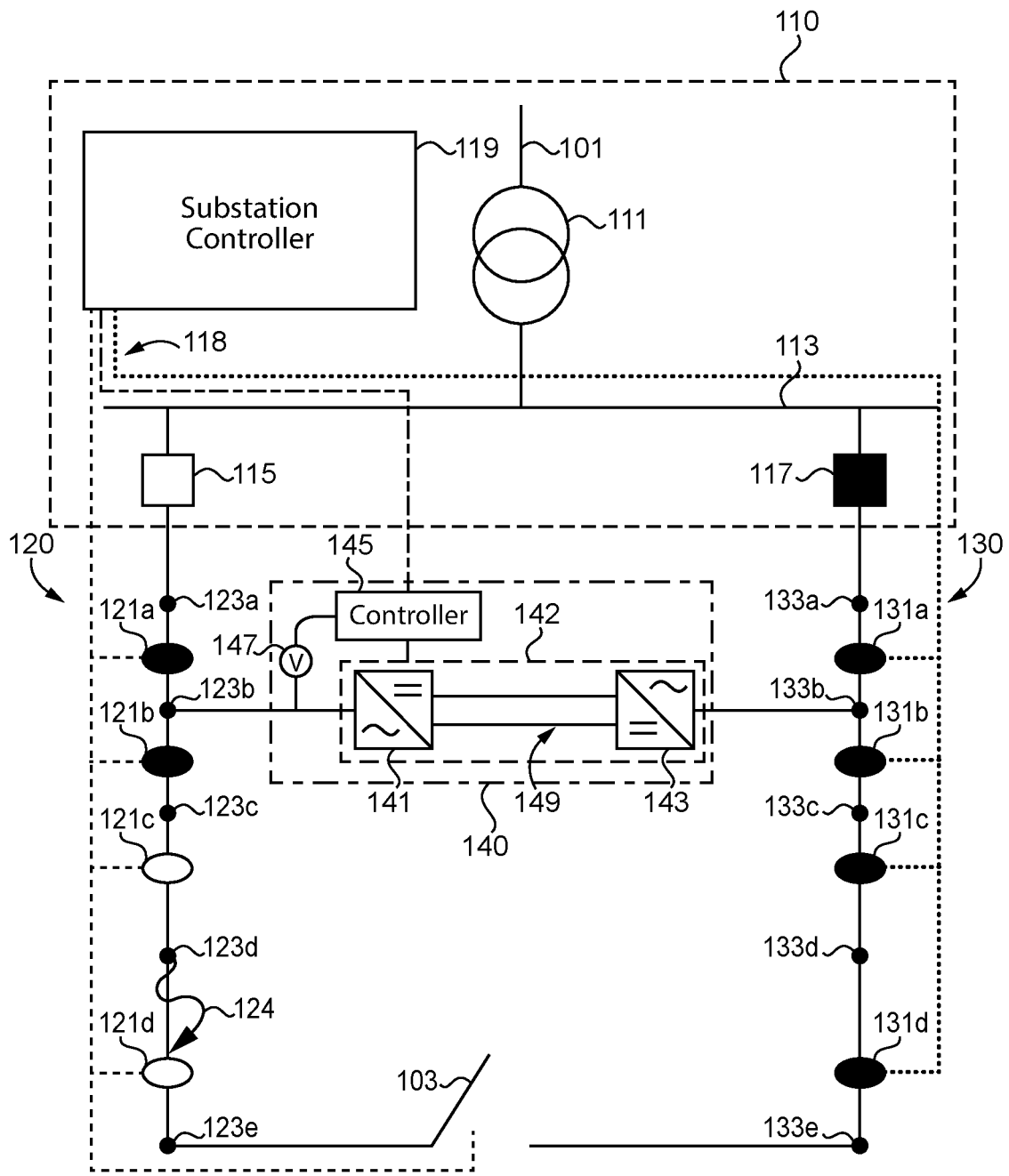
FIG. 1 illustrates an exemplary distribution network.

With reference to FIG. 1, there is illustrated an exemplary medium voltage alternating current (MVAC) distribution network 100 structured to distribute MVAC. It shall be appreciated that the topology of network 100 is illustrated for the purpose of explanation and is not intended as a limitation of the present disclosure. For example, network 100 may include additional substations, additional feeder lines, additional DC links, additional isolation devices, or additional tie switches, to name but a few examples. Although network 100 is illustrated with a single line diagram, network 100 is structured to transmit multiphase power. It shall be appreciated that MVAC includes a voltage between 1000V and 72 kV, low voltage alternating current (LVAC) includes a voltage less than 1000V, and high voltage alternating current (HVAC) includes a voltage greater than 72 kV.

Network 100 includes a substation 110, feeder lines 120 and 130, and direct current (DC) link 140. Substation 110 is coupled to a transmission line 101 and structured to receive HVAC from line 101, step down the received HVAC to MVAC, and output the MVAC. Feeder lines 120 and 130 are coupled to substation 110 and coupled together by tie switch 103. Feeder lines 120 and 130 are structured to receive MVAC from substation 110. DC link 140 is coupled to feeder lines 120 and 130, and structured to transfer LVAC or MVAC between feeder lines 120 and 130. In certain embodiments, DC link 140 may include additional components such as transformers or filters, to name but a few examples.

Substation 110 includes a step-down transformer 111, a medium voltage bus 113, circuit breakers 115 and 117, and substation controller 119. Step-down transformer 111 is coupled to line 101 and bus 113, and structured to receive HVAC from line 101, step down the voltage of the received power to MVAC, and output MVAC to bus 113. Circuit breaker 115 is coupled between bus 113 and feeder line 120, and structured to selectively interrupt MVAC flowing from bus 113 to feeder line 120. Circuit breaker 117 is coupled between bus 113 and feeder line 130, and structured to selectively interrupt MVAC flowing from bus 113 to feeder line 130. Circuit breakers 115 and 117 may be structured to interrupt power flow in response to detecting a fault condition or may be structured to receive a command to interrupt power flow which is transmitted in response to another device detecting the fault condition. Examples of a fault condition, also known as a fault, include a ground fault in a grounded system, or a ground fault in an ungrounded system, to name but a few examples.

Substation controller 119 is structured to communicate with DC link controller 145 and the switching device of network 100 by way of communication channels 118, which may be wired or wireless. Controller 119 is structured to monitor electrical characteristics of network 100 and switch statuses of switching devices of network 100. Controller 119 is structured to control the switching devices of network 100, including circuit breakers 115 and 117, tie switch 103, and the isolation devices of feeder lines 120 and 130. As explained in more detail below, controller 119 may control the switching devices of network 100 in response to receiving commands or measurements from DC link controller 145. In certain embodiments, the isolation devices of feeder line 120 and 130 may instead be operated manually by a field technician.

Feeder line 120 includes a first end coupled to circuit breaker 115 and a second end coupled to tie switch 103. Feeder line 120 also includes isolation devices 121a-121d coupled between a plurality of connection points 123a-e. Each isolation device may be a disconnector switch or another type of switching device structured to interrupt the flow of current through a portion of feeder line 120. Each connection point represents a point on feeder line 120 where a DC link, a distributed energy resource, or a load is coupled. A load may include a medium voltage/low voltage substation, or a device structured to consume MVAC, to name but a few examples. In certain embodiments, each feeder line may include multiple isolation devices coupled between connection points such that a fault may be isolated from all connection points of a feeder line by opening two isolation devices.

Feeder line 130 includes a first end coupled to circuit breaker 117 and a second end coupled to tie switch 103. Feeder line 130 also includes isolation devices 131a-131d coupled between a plurality of connection points 133a-e. Each isolation device is structured to be opened so as to interrupt or prevent the flow of current through a portion of feeder line 130. In certain embodiments, each isolation device may only be operated while a feeder line is deenergized since the isolation device is not structured to interrupt the flow of a load current or fault current. Each connection point represents a point on feeder line 130 where a DC link or a load is coupled. A load may include a medium voltage/low voltage substation, or a device structured to consume MVAC, to name but a few examples.

DC link 140 includes an AC/AC power converter 142, a DC link controller 145, and a measuring device 147. DC link 140 is structured to transmit MVAC between feeder lines 120 and 130 during normal operation of network 100. During a fault condition, DC link 140 is structured to receive MVAC from one feeder line and output LVAC to the other feeder line.

AC/AC power converter 142 includes an AC/DC power converter 141 coupled to connection point 123b, AC/DC power converter 143 coupled to connection point 133b, and a DC bus 149 coupled between converters 141 and 143. DC link controller 145 is structured to operate AC/AC power converter 142 so as to receive MVAC with AC/DC power converter 143, convert the MVAC to DC power with converter 143, output the DC power to DC bus 149, convert the DC power to LVAC or MVAC with AC/DC power converter 143, and output the LVAC or MVAC with converter 141. DC link controller 145 may also be structured to operate AC/AC power converter 142 so as to receive MVAC with AC/DC power converter 141, convert the MVAC to DC power with converter 141, output the DC power to DC bus 149, convert the DC power to LVAC or MVAC with AC/DC power converter 143, and output the LVAC or MVAC with converter 143. The DC power received with DC bus 149 may be either low voltage DC power or medium voltage DC power.

Measuring device 147 is in communication with controller 145 and structured to measure a voltage of the multiphase power transmitted between connection point 123b and DC link 140. Device 147 may be a voltage sensor, a voltage transformer, or another device structured to measure electrical characteristics corresponding to multiphase voltage. Device 147 may communicate with DC link controller 145 by way of a wired or wireless communication channel.

DC link controller 145 is in communication with measuring device 147, substation controller 119, and AC/AC power converter 142. As explained in more detail below, DC link controller 145 is structured to detect a deenergized feeder line, output an LVAC test voltage to the deenergized feeder line, determine fault location while substation controller 119 operates isolation devices of the feeder line, and isolate the fault from a healthy portion or portions of the feeder line. In certain embodiments, DC link controller 145 is structured to perform the functions described with respect to substation controller 119.

In the illustrated embodiment, DC link controller 145 and substation controller 119 have isolated a fault 124 occurring at connection point 123d by opening isolation devices 121c and 121d. DC link controller 145 may detect faults at any point on the feeder lines, including feeder line segments between connection points. To reconnect the healthy portions of feeder line 120 to substation 110, circuit breaker 115 is reclosed after the fault has been isolated and tie switch 103 is also closed.

Figure 2:
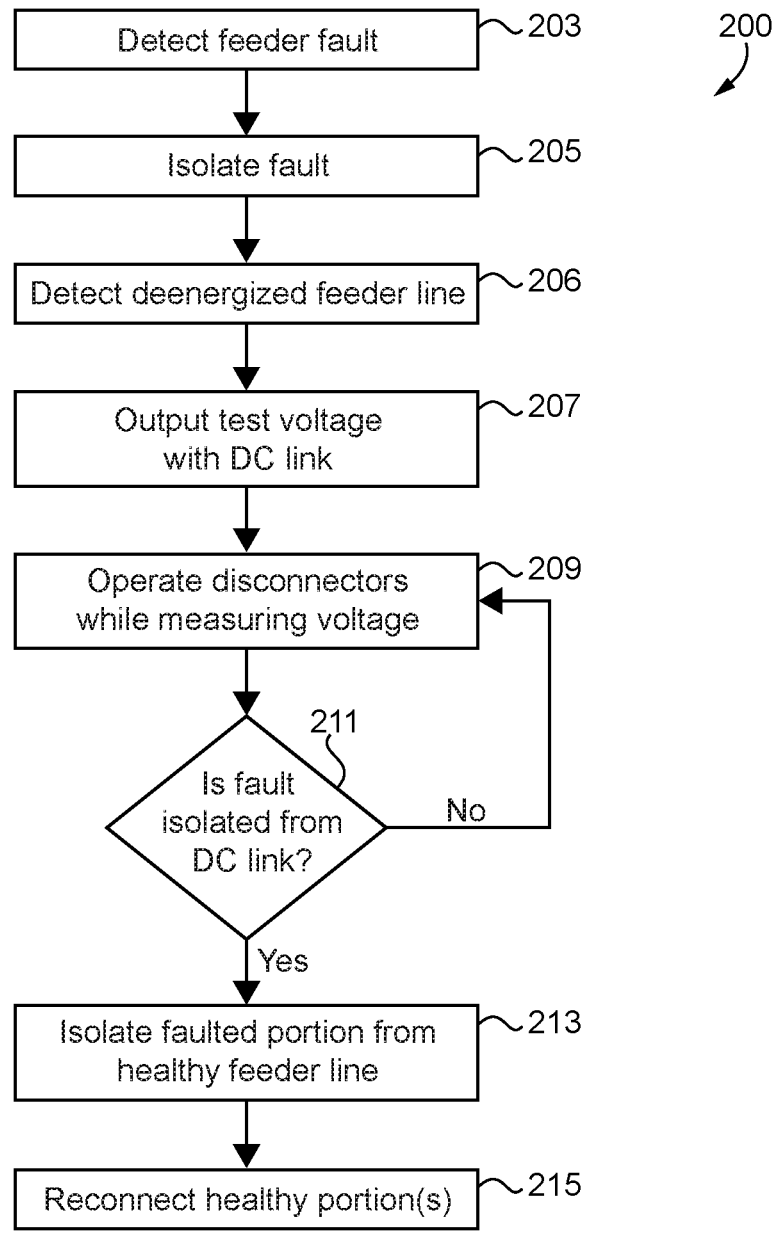
FIG. 2 illustrates an exemplary process for locating and isolating a fault.

With reference to FIG. 2, there is illustrated an exemplary process 200 for mitigating a fault condition in an MVAC distribution network. Process 200 may be implemented with the DC link controller and substation controller of network 100. In certain forms, the switching device operation may be performed by the DC link controller. In certain forms, the DC link controller may perform all control functionalities. It shall be further appreciated that a number of variations and modifications to process 200 are contemplated including, for example, the omission of one or more aspects of process 200, the addition of further conditionals and operations, and/or the reorganization or separation of operations and conditionals into separate processes.

Process 200 begins at operation 203 where a fault condition is detected on a feeder line in the MVAC distribution network. The detected fault may be a ground fault in a grounded system or a ground fault in an ungrounded system, to name but a few examples. The fault may be detected by a relay in a substation and a DC link controller.

Process 200 then proceeds to operation 205 where the feeder line circuit breaker opens in response to the presence of the fault condition. During operation 205, the DC link controller stops any power flow through the DC link to the feeder line with the fault condition. After the feeder line circuit breaker is opened, the affected feeder line is isolated from the substation and becomes deenergized.

Process 200 then proceeds to operation 207 where a DC link outputs power to the deenergized feeder line structured to determine the location of the fault without subjecting the feeder line and attached components to high fault currents. The power includes an LVAC test voltage. The DC link controller controls the output of the DC link so that the output power does not exceed an LVAC threshold. The LVAC threshold may be a value sufficiently low enough to detect the fault location while subjecting loads coupled to the deenergized feeder line to a current less than a fault current flowing through a reclosed substation circuit breaker. For example, the LVAC test voltage may be less than 3% of a nominal MVAC voltage of the MVAC distribution network. In another example, the LVAC test voltage is less than 10% of nominal MVAC voltage. In still another example, the LVAC test voltage is less than 80% of nominal MVAC voltage.

Process 200 proceeds to operation 209 where the disconnector switches are used to locate the fault. A disconnector switch is opened and the feeder voltage proximate to the DC link is measured. If the voltage vectors of the measured voltage are symmetrical, the opened disconnector switch has isolated the fault from the DC link. If the voltage vectors are not symmetrical, the opened disconnector switch has not isolated the fault from the DC link. The disconnector switch may be operated by the substation controller or the DC link controller. In certain embodiments, the DC link controller transmits a measurement, a command, or an analysis of the measurements to a substation controller which operates the disconnector switch in response to receiving data from the DC link controller. For example, the DC link controller may transmit voltage measurements, an instruction to open a particular disconnector switch, or a value indicating whether the voltage measurements are symmetrical.

Process 200 proceeds to conditional 211. If operation 209 isolated the fault, process 200 proceeds to operation 213. If operation 209 did not isolate the fault, process 200 returns to operation 209 where disconnector switches are arranged in another configuration. A loop of operation 209 and conditional 211 continues until the fault is located.

During operation 213, the switching devices on either side of the fault are opened in a configuration that isolates the faulted portion of the feeder line from the healthy portion or portions of the feeder line.

Process 200 then proceeds to operation 215 where the feeder line circuit breaker is reclosed, energizing a healthy portion of the feeder line. If a healthy portion of the feeder line is located at the end of the feeder line, the tie switch may be closed to energize the end of the feeder line. Process 200 then proceeds to end operation 217.

With reference to FIGS. 3A-3I, there is illustrated an exemplary process for mitigating a fault in the MVAC distribution network 100 of FIG. 1. Each figure includes a graph illustrating voltage vectors corresponding to measurements of voltage at point 123b relative to a reference axis.

Figure 3B:
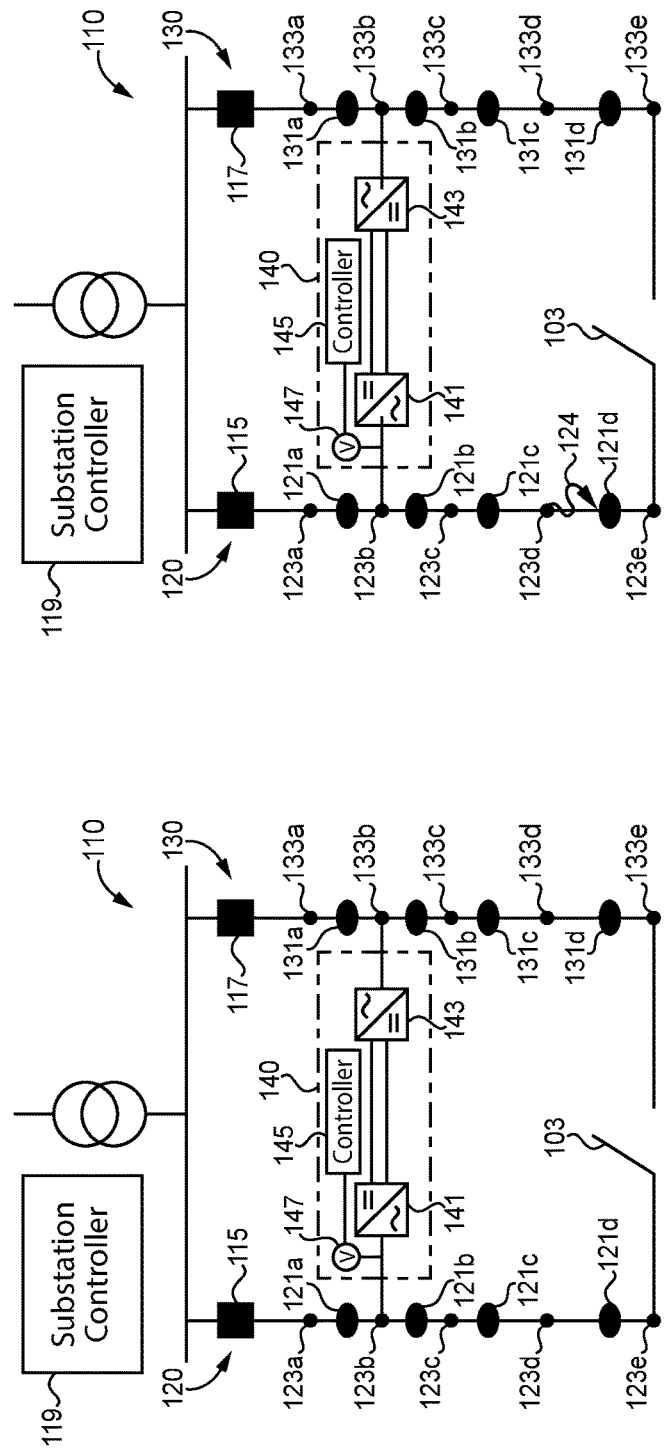
FIGS. 3A-I illustrate the exemplary distribution network of FIG. 1 using the exemplary process of FIG. 2.
Figure 3B:
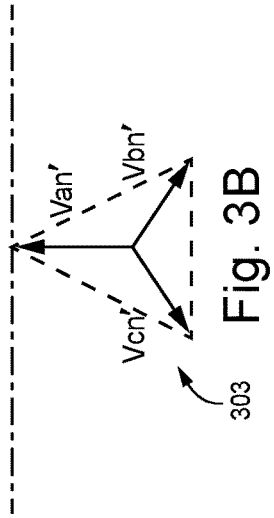
Figure 3A:
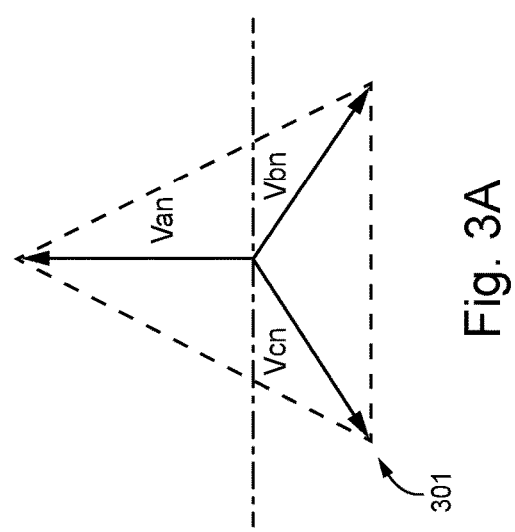

In the initial state of network 100, as shown in FIG. 3A, all portions of feeder lines 120 and 130 are coupled to substation 110 and are receiving MVAC. Graph 301 illustrates symmetrical voltage vectors each having a magnitude of 1 p.u.

As shown in FIG. 3B, feeder line 120 begins to experience a fault condition 124 at connection point 123d between isolation devices 121c and 121d. As illustrated in graph 303, the measured voltage vectors are asymmetrical with a reduced magnitude in response to the fault condition.

Figure 3C:
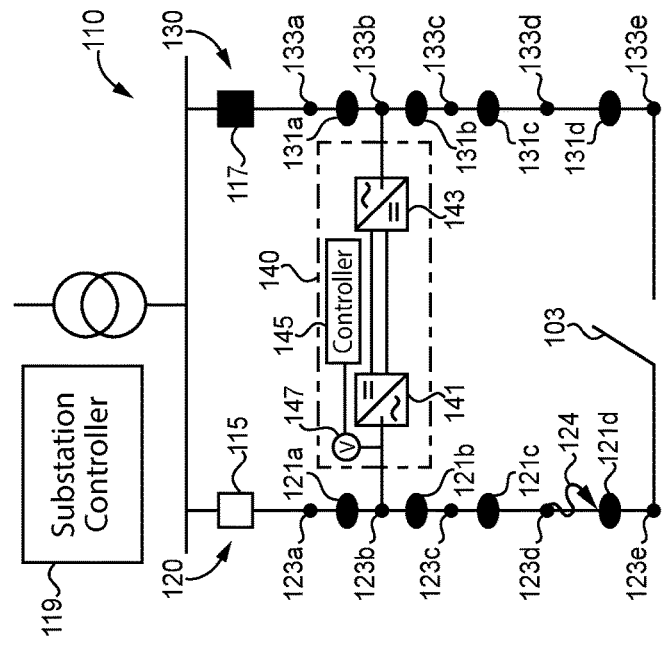
Figure 3C:
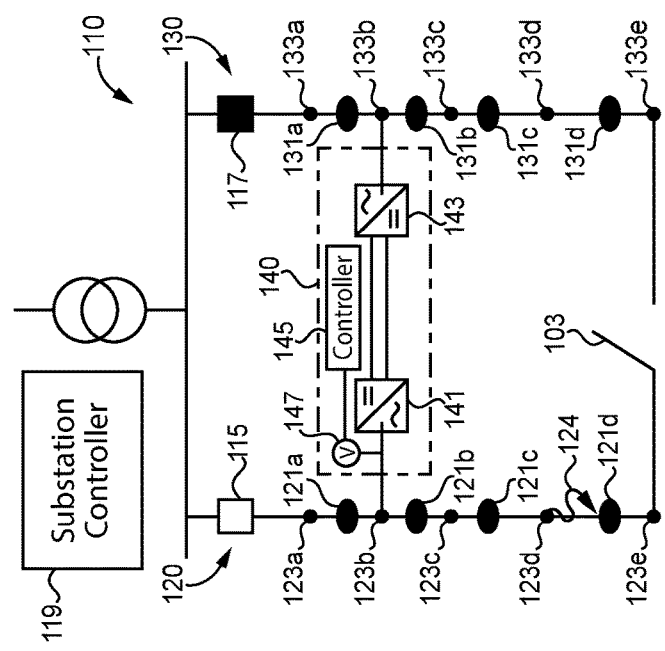

As shown in FIG. 3C, circuit breaker 115 opens in response to detecting fault condition 124, isolating feeder 120 from substation 110. Since substation 110 was the only source of power for feeder line 120, there is no power flowing through feeder line 120. Accordingly, graph 305 illustrates an absence of measured voltage vectors by measuring device 147.

Figure 3D:

As shown in FIG. 3D, DC link 140 begins to apply a small voltage to feeder line 120. Graph 307 illustrates asymmetrical voltage vectors with magnitudes corresponding to low voltage. Since DC link 140 is not isolated from fault condition 124, the voltage vectors remain asymmetrical.

Figure 3F:
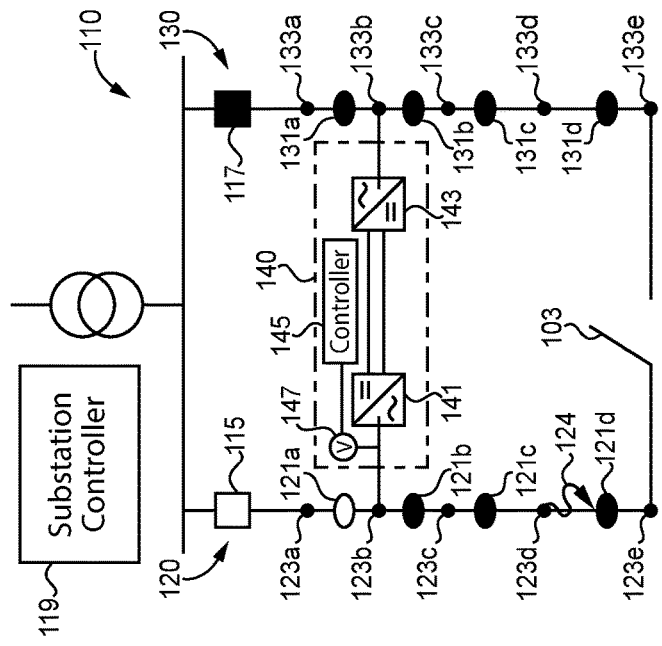
Figure 3F:
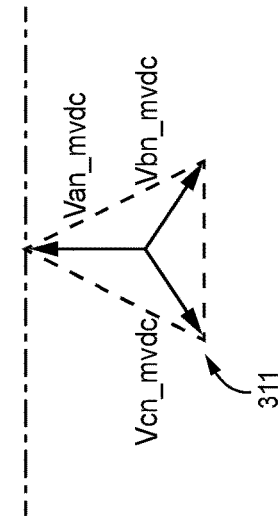
Figure 3E:
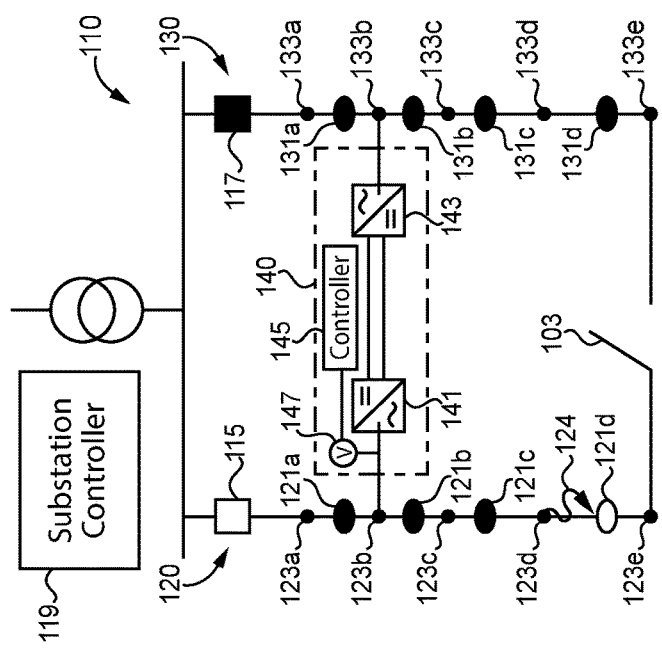
Figure 3E:
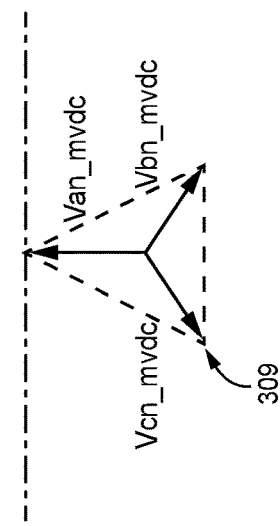
Figure 3G:
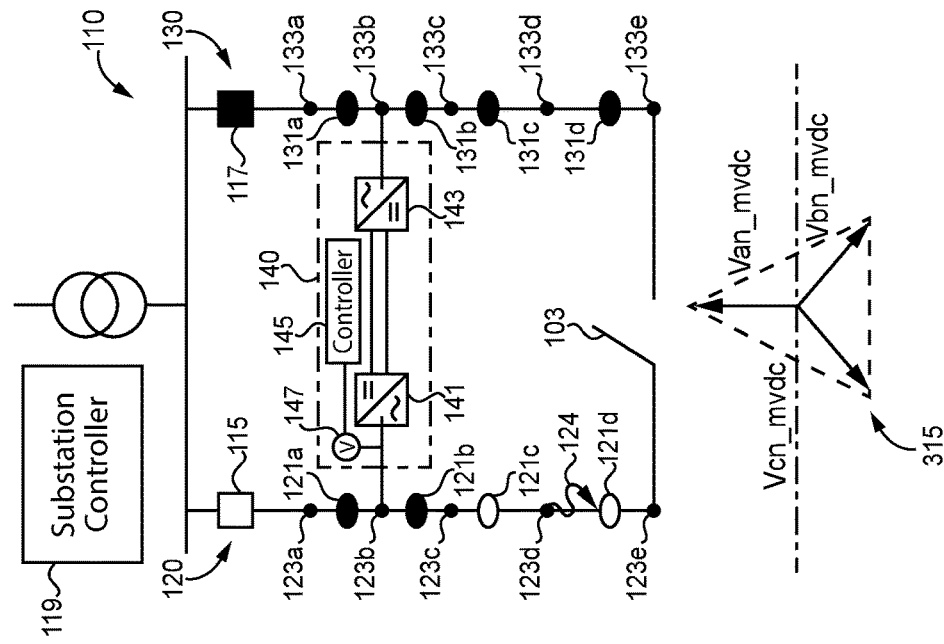

As shown in FIGS. 3E-3G, the substation controller 119 begins to operate the isolation devices while DC link controller 145 measures voltages following each operation. In the illustrated process, the farthest isolation device on either side of the DC link connection point is opened first, followed by the second farther and so on until the fault is isolated from the DC link. In other embodiments, the isolation device may be opened in another pattern.

In FIG. 3E, substation controller 119 opens isolation device 121d. As shown in graph 309, the voltage vectors remain asymmetrical and, therefore, DC link controller 145 will determine fault condition 124 has not been isolated from the DC link 140.

In FIG. 3F, substation controller 119 opens isolation device 121a. As shown in graph 311, the voltage vectors remain asymmetrical and, therefore, DC link controller 145 will determine fault condition 124 has not been isolated from DC link 140.

In FIG. 3G, substation controller 119 opens isolation device 121c. As shown in graph 313, the voltage vectors become symmetrical and, therefore, DC link controller 145 will determine fault 124 has been isolated from DC link 140.

Figure 3H:
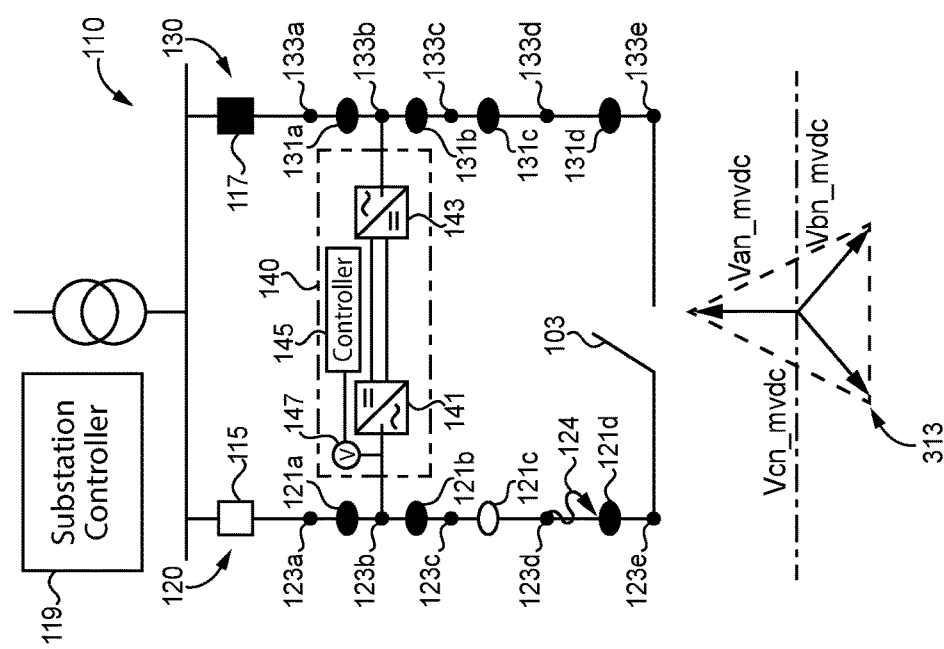

In FIG. 3H, substation controller 119 isolates fault 124 from a healthy portion of feeder line 120 by opening isolation device 121d.

Figure 3I:
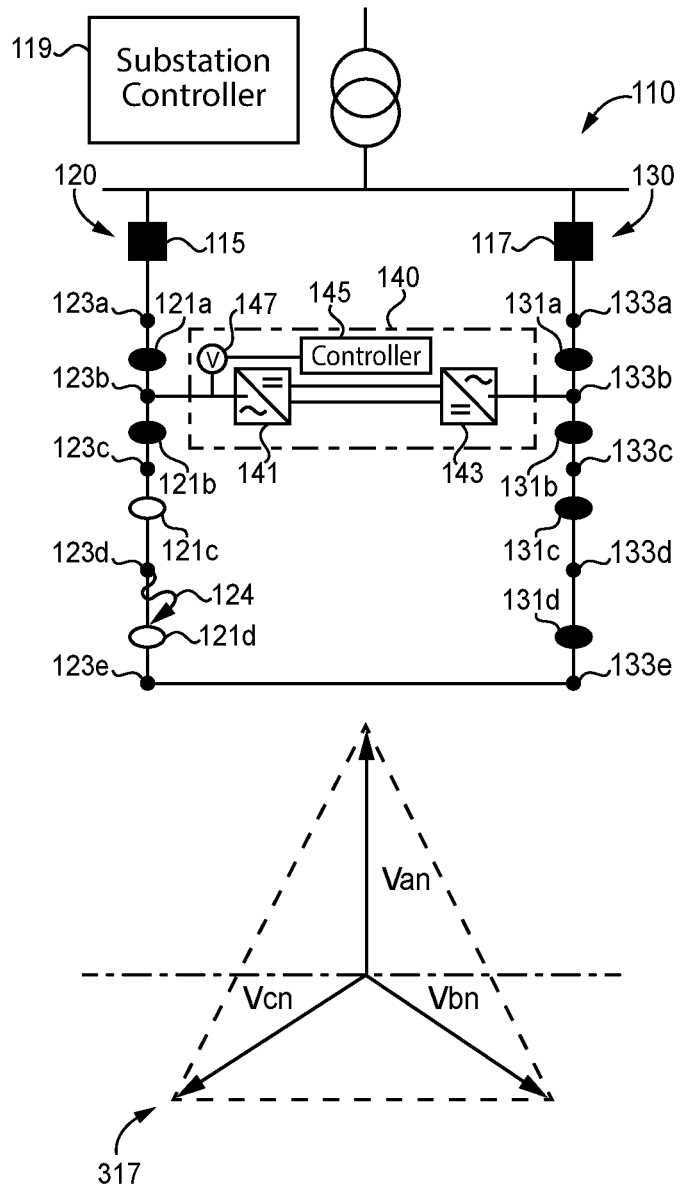

Finally, in FIG. 3I, the healthy portions of feeder line 120 are reenergized in response to isolating the faulted portion of the feeder line by closing tie switch 103 and circuit breaker 115. Graph 317 illustrates symmetrical voltage vectors each having a magnitude of 1 p.u.

Further written description of a number of exemplary embodiments shall now be provided. One embodiment is a fault mitigation system for a medium voltage alternating current (MVAC) distribution network including a first feeder line and a second feeder line, the first feeder line including a plurality of isolation devices, the fault mitigation system comprising: a direct current (DC) link coupled to the first feeder line and the second feeder line; and a control system structured to determine the first feeder line is deenergized, operate the DC link so as to receive MVAC from the second feeder line and output low voltage alternating current (LVAC) to the first feeder line, operate the plurality of isolation devices, measure the LVAC in response to operating the plurality of isolation devices, determine a fault is isolated from a healthy portion of the first feeder line using the received LVAC voltage measurements, and reenergize the healthy portion of the first feeder line.

In certain forms of the foregoing fault mitigation system, the LVAC includes a voltage less than 1000V and the MVAC includes a voltage between 1000V and 72 kV. In certain forms, a voltage of the LVAC is equal to or less than 3% of a voltage of the MVAC. In certain forms, the first feeder line includes a circuit breaker structured to selectively interrupt the flow of MVAC from a substation to the first feeder line, wherein the control system is structured to detect the fault in the first feeder line and open the circuit breaker in response to detecting the fault before determining the first feeder line is deenergized, and wherein reenergizing the healthy portion of the first feeder line includes closing the circuit breaker. In certain forms, determining the fault is isolated from the healthy portion of the first feeder line includes determining a set of voltages of the received LVAC measurements are symmetrical. In certain forms, the DC link includes a bidirectional AC/AC converter structured to receive MVAC from the second feeder line, convert the MVAC to DC power, and convert the DC power to LVAC. In certain forms, the control system is structured to isolate a second healthy portion of the first feeder line in response to determining the fault is isolated from the first healthy portion, and reenergize the second healthy portion of the first feeder line in response to isolating the second healthy portion. In certain forms, the control system includes a substation controller, a DC link controller, and a measuring device.

Another exemplary embodiment is a fault mitigation system for a medium voltage alternating current (MVAC) distribution network including a first feeder line and a second feeder line, the first feeder line including a plurality of isolation devices, the fault mitigation system comprising: a direct current (DC) link coupled to the first feeder line and the second feeder line; and a control system structured to determine the first feeder line has been deenergized in response to a fault, operate the DC link so as to receive MVAC from the second feeder line and output low voltage alternating current (LVAC) to the first feeder line, receive a first set of voltage measurements corresponding to the LVAC, open a first isolation device of the plurality of isolation devices in response to receiving the first set of voltage measurements, receive a second set of voltage measurements corresponding to the LVAC, determine the fault is isolated from a healthy portion of the first feeder line using the second set of measurements, and reenergize a portion of the first feeder line in response to determining the fault is isolated.

In certain forms of the foregoing fault mitigation system, a voltage of the LVAC is equal to or less than 3% of a voltage of the MVAC. In certain forms, the first feeder line includes a circuit breaker structured to selectively interrupt the flow of MVAC from a substation to the first feeder line, wherein the control system is structured to detect the fault in the first feeder line and open the circuit breaker in response to detecting the fault before determining the first feeder line is deenergized, and wherein reenergizing the healthy portion of the first feeder line includes closing the circuit breaker for the first time since opening the circuit breaker in response to detecting the fault. In certain forms, the first set of voltage measurements are unsymmetrical, and wherein determining the fault is isolated from the healthy portion of the first feeder line includes determining the second set of voltage measurements are symmetrical. In certain forms, the fault includes a ground fault, and wherein the MVAC distribution network is structured as an ungrounded network. In certain forms, the control system is structured to isolate a second healthy portion of the first feeder line using a tie switch in response to determining the fault is isolated from the first healthy portion and reenergize the second healthy portion of the first feeder line in response to isolating the second healthy portion.

A further exemplary embodiment is a method for mitigating a fault in a medium voltage alternating current (MVAC) distribution network including a first feeder line and a second feeder line, the method comprising: operating, with a DC link controller, a direct current (DC) link coupled to the first feeder line and the second feeder line; determining, with the DC link controller, the first feeder line is deenergized; operating, with the DC link controller, the DC link so as to receive MVAC from the second feeder line and output power to establish the LVAC test voltage in the first feeder line; operating, with a substation controller, a plurality of isolation devices coupled to the first feeder line; measuring, with a measuring device, the LVAC test voltage in response to operating the plurality of isolation devices; determining, with the DC link controller, a fault is isolated from a healthy portion of the first feeder line using the received LVAC test voltage measurements; and reenergizing, with the substation controller, the healthy portion of the first feeder line.

In certain forms of the foregoing method, the LVAC test voltage includes a voltage less than 1000V and the MVAC includes a voltage between 1000V and 72 kV, and wherein the LVAC test voltage is equal to or less than 3% of a voltage of the MVAC. In certain forms, the first feeder line includes a circuit breaker structured to selectively interrupt the flow of MVAC from a substation to the first feeder line, wherein the circuit breaker is structured to detect the fault in the first feeder line and open the circuit breaker in response to detecting the fault before determining the first feeder line is deenergized, and wherein reenergizing the healthy portion of the first feeder line includes closing the circuit breaker. In certain forms, determining the fault is isolated from the healthy portion of the first feeder line includes determining a set of voltages of the received LVAC test voltage measurements are symmetrical. In certain forms, the DC link controller is structured to isolate a second healthy portion of the first feeder line in response to determining the fault is isolated from the first healthy portion and reenergize the second healthy portion of the first feeder line in response to isolating the second healthy portion. In certain forms, the fault includes a ground fault, and wherein the MVAC distribution network is structured as an ungrounded network.

It is contemplated that the various aspects, features, processes, and operations from the various embodiments may be used in any of the other embodiments unless expressly stated to the contrary. Certain operations illustrated may be implemented by a computer including a processing device executing a computer program product on a non-transient, computer-readable storage medium, where the computer program product includes instructions causing the processing device to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A fault mitigation system for a medium voltage alternating current (MVAC) distribution network including a first feeder line and a second feeder line, the first feeder line including a plurality of isolation devices, the fault mitigation system comprising:
   a direct current (DC) link coupled to the first feeder line and the second feeder line; and
   a control system structured to determine the first feeder line is deenergized, operate the DC link so as to receive MVAC from the second feeder line and output low voltage alternating current (LVAC) to the first feeder line, operate the plurality of isolation devices, measure the LVAC in response to operating the plurality of isolation devices, determine a fault is isolated from a healthy portion of the first feeder line using the received LVAC voltage measurements, and reenergize the healthy portion of the first feeder line.

2. The fault mitigation system of claim 1 wherein the LVAC includes a voltage less than 1000V and the MVAC includes a voltage between 1000V and 72 kV.

3. The fault mitigation system of claim 2 wherein a voltage of the LVAC is equal to or less than 3% of a voltage of the MVAC.

4. The fault mitigation system of claim 1 wherein the first feeder line includes a circuit breaker structured to selectively interrupt the flow of MVAC from a substation to the first feeder line, wherein the control system is structured to detect the fault in the first feeder line and open the circuit breaker in response to detecting the fault before determining the first feeder line is deenergized, and wherein reenergizing the healthy portion of the first feeder line includes closing the circuit breaker.

5. The fault mitigation system of claim 1 wherein determining the fault is isolated from the healthy portion of the first feeder line includes determining a set of voltages of the received LVAC measurements are symmetrical.

6. The fault mitigation system of claim 1 wherein the DC link includes a bidirectional AC/AC converter structured to receive MVAC from the second feeder line, convert the MVAC to DC power, and convert the DC power to LVAC.

7. The fault mitigation system of claim 1 wherein the control system is structured to isolate a second healthy portion of the first feeder line in response to determining the fault is isolated from the first healthy portion and reenergize the second healthy portion of the first feeder line in response to isolating the second healthy portion.

8. The fault mitigation system of claim 1 wherein the control system includes a substation controller, a DC link controller, and a measuring device.

9. A fault mitigation system for a medium voltage alternating current (MVAC) distribution network including a first feeder line and a second feeder line, the first feeder line including a plurality of isolation devices, the fault mitigation system comprising:
a direct current (DC) link coupled to the first feeder line and the second feeder line; and
a control system structured to determine the first feeder line has been deenergized in response to a fault, operate the DC link so as to receive MVAC from the second feeder line and output low voltage alternating current (LVAC) to the first feeder line, receive a first set of voltage measurements corresponding to the LVAC, open a first isolation device of the plurality of isolation devices in response to receiving the first set of voltage measurements, receive a second set of voltage measurements corresponding to the LVAC, determine the fault is isolated from a healthy portion of the first feeder line using the second set of measurements, and reenergize a portion of the first feeder line in response to determining the fault is isolated.

10. The fault mitigation system of claim 9 wherein a voltage of the LVAC is equal to or less than 3% of a voltage of the MVAC.

11. The fault mitigation system of claim 9 wherein the first feeder line includes a circuit breaker structured to selectively interrupt the flow of MVAC from a substation to the first feeder line, wherein the control system is structured to detect the fault in the first feeder line and open the circuit breaker in response to detecting the fault before determining the first feeder line is deenergized, and wherein reenergizing the healthy portion of the first feeder line includes closing the circuit breaker for the first time since opening the circuit breaker in response to detecting the fault.

12. The fault mitigation system of claim 9 wherein the first set of voltage measurements are unsymmetrical, and wherein determining the fault is isolated from the healthy portion of the first feeder line includes determining the second set of voltage measurements are symmetrical.

13. The fault mitigation system of claim 9 wherein the fault includes a ground fault, and wherein the MVAC distribution network is structured as an ungrounded network.

14. The fault mitigation system of claim 9 wherein the control system is structured to isolate a second healthy portion of the first feeder line using a tie switch in response to determining the fault is isolated from the first healthy portion and reenergize the second healthy portion of the first feeder line in response to isolating the second healthy portion.

15. A method for fault mitigation in a medium voltage alternating current (MVAC) distribution network including a first feeder line and a second feeder line, the method comprising:
operating, with a DC link controller, a direct current (DC) link coupled to the first feeder line and the second feeder line;
determining, with the DC link controller, the first feeder line is deenergized;
operating, with the DC link controller, the DC link so as to receive MVAC from the second feeder line and output power to establish the LVAC test voltage in the first feeder line;
operating, with a substation controller, a plurality of isolation devices coupled to the first feeder line;
measuring, with a measuring device, the LVAC test voltage in response to operating the plurality of isolation devices;
determining, with the DC link controller, a fault is isolated from a healthy portion of the first feeder line using the received LVAC test voltage measurements; and
reenergizing, with the substation controller, the healthy portion of the first feeder line.

16. The method of claim 15 wherein the LVAC test voltage includes a voltage less than 1000V and the MVAC includes a voltage between 1000V and 72 kV, and wherein the LVAC test voltage is equal to or less than 3% of a voltage of the MVAC.

17. The method of claim 15 wherein the first feeder line includes a circuit breaker structured to selectively interrupt the flow of MVAC from a substation to the first feeder line, wherein the circuit breaker is structured to detect the fault in the first feeder line and open the circuit breaker in response to detecting the fault before determining the first feeder line is deenergized, and wherein reenergizing the healthy portion of the first feeder line includes closing the circuit breaker.

18. The method of claim 15 wherein determining the fault is isolated from the healthy portion of the first feeder line includes determining a set of voltages of the received LVAC test voltage measurements are symmetrical.

19. The method of claim 15 wherein the DC link controller is structured to isolate a second healthy portion of the first feeder line in response to determining the fault is isolated from the first healthy portion and reenergize the second healthy portion of the first feeder line in response to isolating the second healthy portion.

20. The method of claim 15 wherein the fault includes a ground fault, and wherein the MVAC distribution network is structured as an ungrounded network.

* * * * *